(12) United States Patent
Quercia et al.

(10) Patent No.: US 12,272,922 B2
(45) Date of Patent: Apr. 8, 2025

(54) ELECTRONIC CHIP SUPPORT DEVICE AND CORRESPONDING MANUFACTURING METHOD

(71) Applicant: STMICROELECTRONICS (GRENOBLE 2) SAS, Grenoble (FR)

(72) Inventors: Fabien Quercia, Saint Marcelin (FR); Jean-Michel Riviere, Froges (FR)

(73) Assignee: STMICROELECTRONICS (GRENOBLE 2) SAS, Grenoble (FR)

( * ) Notice: Subject to any disclaimer, the term of this patent is extended or adjusted under 35 U.S.C. 154(b) by 0 days.

(21) Appl. No.: 18/408,149

(22) Filed: Jan. 9, 2024

(65) Prior Publication Data

US 2024/0146019 A1    May 2, 2024

Related U.S. Application Data

(62) Division of application No. 17/229,710, filed on Apr. 13, 2021, now Pat. No. 11,916,353.

(30) Foreign Application Priority Data

Apr. 16, 2020 (FR) ...................... 2003845

(51) Int. Cl.
  *H01S 5/02345* (2021.01)
  *H01L 23/00* (2006.01)
(52) U.S. Cl.
  CPC .......... *H01S 5/02345* (2021.01); *H01L 24/48* (2013.01); *H01L 24/85* (2013.01);
  (Continued)
(58) Field of Classification Search
  CPC .... H01S 5/02345; H01S 5/183; H01S 5/0236; H01S 5/02375; H01L 24/32; H01L 24/83; H01L 24/48; H01L 24/85; H01L 24/29; H01L 23/3121; H01L 24/92; H01L 24/16; H01L 23/49811; H01L 21/563; H01L 23/3157; H01L 24/81; H01L 24/13; H01L 23/3675; H01L 23/3185; H01L 23/29; H01L 23/3128; H01L 23/3114; H01L 23/5385; H01L 23/562; H01L 25/50; H01L 21/50; H01L 23/3735; H01L 25/0657; H01L 25/0652; H01L 2224/83385;
  (Continued)

(56) References Cited

U.S. PATENT DOCUMENTS

| | | |
|---|---|---|
| 5,214,307 A | 5/1993 | Davis |
| 7,008,301 B1 | 3/2006 | Raeder |

(Continued)

FOREIGN PATENT DOCUMENTS

| | | |
|---|---|---|
| CN | 103426780 A | 12/2013 |
| EP | 1788673 A1 | 5/2007 |

(Continued)

*Primary Examiner* — Mouloucoulaye Inoussa
(74) *Attorney, Agent, or Firm* — Seed IP Law Group LLP (57) ABSTRACT

Electronic device comprising a support substrate having a mounting face and an electronic chip having a rear face bonded on the mounting face by a volume of adhesive, wherein the support substrate comprises a plurality of wedging elements projecting from the mounting face so as to hold the chip bearing on contact areas of the wedging elements in a position substantially parallel to the mounting face of the support substrate.

20 Claims, 5 Drawing Sheets

(52) U.S. Cl.
CPC ............... *H01L 2224/48091* (2013.01); *H01L 2224/48227* (2013.01); *H01L 2924/12042* (2013.01); *H01L 2924/18165* (2013.01)

(58) Field of Classification Search
CPC . H01L 2224/48091; H01L 2224/83447; H01L 2224/83444; H01L 2224/26165; H01L 2924/18165; H01L 2924/19107; H01L 2224/2919; H01L 2224/29015; H01L 2224/48227; H01L 2224/29012; H01L 2924/00012; H01L 2924/00014; H01L 2224/73265; H01L 2224/32225; H01L 23/49894; H01L 23/49838; H01L 2224/81815; H01L 2224/81024; H01L 2224/16225; H01L 2224/16227; H01L 2924/15151; H01L 2224/13101; H01L 2924/181; H01L 2224/73204; H01L 2924/014; H01L 2224/2929; H01L 2924/0665; H01L 2224/13139; H01L 2224/05655; H01L 2224/05666; H01L 2224/13118; H01L 2224/8385; H01L 2224/05671; H01L 2224/81801; H01L 2924/07802; H01L 2224/05124; H01L 2224/83203; H01L 2224/73253; H01L 2224/05172; H01L 2224/13113; H01L 2224/05684; H01L 2224/92225; H01L 2224/131; H01L 2224/29139; H01L 2225/06589; H01L 2224/16145; H01L 2224/17181; H01L 2224/80896; H01L 2224/29011; H01L 2224/81399
See application file for complete search history.

(56) References Cited

U.S. PATENT DOCUMENTS

| | | |
|---|---|---|
| 7,148,560 B2 | 12/2006 | Lee et al. |
| 7,880,317 B2 | 2/2011 | Ohde et al. |
| 8,063,474 B2 | 11/2011 | Liu et al. |
| 9,064,879 B2 | 6/2015 | Hung et al. |
| 11,101,214 B2 | 8/2021 | Tsai et al. |
| 11,251,119 B2 | 2/2022 | Yu et al. |
| 11,282,779 B2 | 3/2022 | Wu et al. |
| 11,315,860 B2 | 4/2022 | Chu et al. |
| 11,315,863 B2 | 4/2022 | Choi |
| 11,322,453 B2 | 5/2022 | Hsu |
| 11,355,454 B2 | 6/2022 | Tsai et al. |
| 11,373,946 B2 | 6/2022 | Huang et al. |
| 11,410,897 B2 | 8/2022 | Wu et al. |
| 11,410,982 B2 | 8/2022 | Yang et al. |
| 11,417,569 B2 | 8/2022 | Chiu |
| 11,417,580 B2 | 8/2022 | Yu et al. |
| 11,450,581 B2 | 9/2022 | Lo et al. |
| 11,456,287 B2 | 9/2022 | Hu et al. |
| 11,462,418 B2 | 10/2022 | Lin et al. |
| 11,469,215 B2 | 10/2022 | Chen et al. |
| 11,521,905 B2 | 12/2022 | Wang et al. |
| 11,557,559 B2 | 1/2023 | Lee et al. |
| 11,574,857 B2 | 2/2023 | Yang et al. |
| 11,581,281 B2 | 2/2023 | Yu et al. |
| 11,609,562 B2 | 3/2023 | Kean et al. |
| 2005/0242422 A1 | 11/2005 | Klein et al. |
| 2005/0277231 A1 | 12/2005 | Hembree et al. |
| 2008/0179737 A1 | 7/2008 | Haga et al. |
| 2009/0263938 A1 | 10/2009 | Ino |
| 2009/0283317 A1 | 11/2009 | Ozawa |
| 2010/0139962 A1 | 6/2010 | Kaneko |
| 2010/0181667 A1 | 7/2010 | Iwase et al. |
| 2010/0244229 A1 | 9/2010 | Vittu |
| 2011/0089575 A1 | 4/2011 | Lee |
| 2012/0171814 A1 | 7/2012 | Choi et al. |
| 2013/0214368 A1 | 8/2013 | Fonk et al. |
| 2013/0344652 A1 | 12/2013 | Haba et al. |
| 2014/0319661 A1 | 10/2014 | Pagaila |
| 2015/0061104 A1 | 3/2015 | Takahashi et al. |
| 2016/0315028 A1* | 10/2016 | Chou ..................... H01L 24/94 |
| 2019/0035737 A1 | 1/2019 | Wu et al. |
| 2019/0096868 A1 | 3/2019 | Tsou et al. |
| 2019/0267310 A1* | 8/2019 | Rodriguez ........ H01L 23/49503 |
| 2019/0318987 A1 | 10/2019 | Lin et al. |
| 2019/0363157 A1 | 11/2019 | Karashima |
| 2020/0006196 A1 | 1/2020 | Lin et al. |
| 2020/0152543 A1* | 5/2020 | Lin ......................... H01L 24/14 |
| 2020/0286874 A1 | 9/2020 | Takahashi et al. |
| 2020/0411439 A1 | 12/2020 | Teng et al. |
| 2021/0066148 A1* | 3/2021 | Kim ....................... H01L 24/83 |
| 2021/0074682 A1 | 3/2021 | Chen et al. |
| 2021/0098332 A1 | 4/2021 | Wang et al. |
| 2021/0242119 A1 | 8/2021 | Ho et al. |
| 2021/0265306 A1 | 8/2021 | Wu et al. |
| 2021/0287957 A1* | 9/2021 | Lin .................... H01L 25/0657 |
| 2022/0077076 A1* | 3/2022 | Sinha .................... H01L 23/562 |
| 2022/0310501 A1 | 9/2022 | Wang et al. |

FOREIGN PATENT DOCUMENTS

| | | |
|---|---|---|
| EP | 2444999 A1 | 4/2012 |
| JP | S58207645 A | 12/1983 |
| JP | H02146757 A | 6/1990 |
| JP | H03149864 A | 6/1991 |
| JP | H0547988 A | 2/1993 |
| JP | H05267362 A | 10/1993 |
| JP | 2007194383 A | 8/2007 |

\* cited by examiner

ELECTRONIC CHIP SUPPORT DEVICE AND CORRESPONDING MANUFACTURING METHOD

BACKGROUND

Technical Field

Embodiments and implementations of the disclosure relate to the field of microelectronics and more particularly the field of packaging of electronic devices comprising electronic chips bonded on a support surface.

Description of the Related Art

Conventional electronic devices comprise a support substrate including a network of electrical connections and a mounting face on which a rear face of an electronic chip is bonded by means of a volume of adhesive. The electronic chip can further comprise a front face on which an optical element is incorporated.

Conventionally, the volume of adhesive includes an adhesive liquid and microspheres, usually referred to as "filler", an average diameter of which is calibrated, typically between 25 μm (micrometers) and 150 μm. The microspheres are intended to support the rear face of the electronic chip so as to hold the electronic chip parallel to the mounting face of the support substrate, in particular during a drying period of the adhesive liquid.

Such arrangements present difficulties in so far as the distribution of the microspheres over the mounting face may not be uniform, in particular if the bonded surface is small, for example of order 1 mm² (square millimeter). The rear face of the electronic chip is then not uniformly supported by the microspheres, which can lead to an inclination of the electronic chip with respect to the mounting face of the substrate, which is particularly significant when the dimensions of the bonded surface are small.

The inclination of the electronic chip with respect to the mounting face is particularly problematic when an optical element is incorporated on the front face of the chip and this optical element requires precise orientation conditions.

Hence, it is desirable to control the inclination of the electronic chip with respect to the mounting face of the support substrate, in particular during bonding of the electronic chip on the support substrate.

BRIEF SUMMARY

One aspect of the disclosure proposes an electronic device comprising a support substrate having a mounting face and an electronic chip having a rear face on the mounting face by a volume of adhesive, wherein the support substrate comprises a plurality of wedging elements projecting from the mounting face so as to hold the chip bearing on contact areas of the wedging elements in a position parallel to the mounting face of the support substrate.

Thus, the plurality of wedging elements can support the rear face of the electronic chip and hold the rear face of the chip in a fixed position, in particular during drying of the volume of adhesive.

The electronic chip is then held in place with respect to the mounting face of the support substrate, and this is so independently of the type of adhesive used.

According to an alternative, the plurality of wedging elements comprises arcuate wire bonds each comprising a first end and a second end soldered to the mounting face of the support substrate, and an extremum forming said contact areas with the rear face of the electronic chip. According to another alternative, the plurality of wedging elements comprises wire-bond stud bumps soldered on the mounting face of the support substrate, each having one end of severed wire bond forming said contact areas with the rear face of the electronic chip.

According to another alternative, the mounting face of the support substrate is covered with a resin solder mask, and the plurality of wedging elements comprises local thicknesses projecting from the resin of the solder mask, each having an upper surface forming said contact areas with the rear face of the electronic chip.

According to another alternative, the support substrate comprises an interconnection network including metal tracks, and the plurality of wedging elements has local thicknesses projecting from insulated portions of the metal tracks, each comprising an upper surface forming said contact areas with the rear face of the electronic chip.

The various alternatives of embodiments defined above each have the advantage of using elements which are typically already present in the devices, thus allowing method steps which are typically already envisaged, known and controlled to be reused. Hence this advantageously makes it possible to correctly and economically control the manufacturing of the wedging elements.

According to an embodiment, the wedging elements are distributed at points on the mounting face of the support substrate.

In other words, the wedging elements are distributed at points, in the form of pads, cylindrical volumes or generally in the form of elementary units comprising insulated contact areas, making it possible to support the rear face of the electronic chip in a stable position on a plurality of support points.

According to an embodiment, the wedging elements have a shape extending longitudinally along the mounting face of the support substrate.

In other words, the wedging elements extend longitudinally, for example in the form of slabs, elongate parallelepipeds or generally in the form of elongate strips of a controlled thickness, and an oblong upper surface of which forms a longitudinal contact area for supporting the rear face of the electronic chip.

According to an embodiment, the volume of adhesive is disposed around the wedging elements without covering said contact areas.

For example, the wedging elements can be disposed at the periphery of an area of the support substrate intended to receive the rear face; the wedging elements are spaced apart from the center of the electronic chip which makes it possible to increase the stability of the support of the electronic chip.

According to an embodiment, the electronic chip includes at least one optical element incorporated on the front face of the electronic chip.

According to another aspect, a manufacturing method of an electronic device is proposed, comprising:
  preparing a support substrate comprising forming a plurality of wedging elements projecting from a mounting face of the support substrate, and
  mounting an electronic chip held bearing on the contact areas of the wedging elements in a position parallel to the mounting face of the support substrate, comprising bonding of a rear face of the electronic chip on the mounting face of the support substrate by means of a volume of adhesive.

According to an implementation, the forming of the plurality of wedging elements comprises, for each wedging element:
soldering a first end of a wire bond on the mounting face;
stretching the wire bond in order to give it an arcuate shape; and
soldering a second end of the wire bond on the mounting face.

According to an implementation, the forming of the plurality of wedging elements comprises, for each wedging element:
soldering a wire-bond stud bump on the mounting face; and
severing the associated wire bond at the stud bump.

According to an implementation, the method further comprises forming a resin soldering mask covering the mounting face of the support substrate, wherein the forming of the plurality of wedging elements comprises, during the forming of the resin of the solder mask, forming at least one local thickness projecting from said resin so as to present an upper surface forming said contact areas with the rear face of the electronic chip.

According to an implementation, the method comprises forming metal tracks of an interconnection network of the support substrate, wherein the forming of the plurality of wedging elements comprises, during the forming of the metal tracks, forming at least one local thickness projecting from an insulated portion of metal track so as to present an upper surface forming said contact areas with the rear face of the electronic chip.

According to an implementation, the forming of the plurality of projecting wedging elements comprises a placement distributed at points on the mounting face of the support substrate.

According to an implementation the forming of the plurality of projecting wedging elements comprises a longitudinal forming of the wedging elements along the mounting face of the support substrate.

According to an implementation, the bonding of the rear face of the electronic chip comprises depositing the volume of adhesive around the wedging elements without covering said contact areas.

According to an implementation, the electronic chip includes at least one optical element incorporated on the front face of the electronic chip.

BRIEF DESCRIPTION OF THE SEVERAL VIEWS OF THE DRAWINGS

Advantages and features of the disclosure shall become evident from the detailed description of embodiments and implementations that are in no way limiting, and from the enclosed drawings in which.

DETAILED DESCRIPTION

Figure 1A:
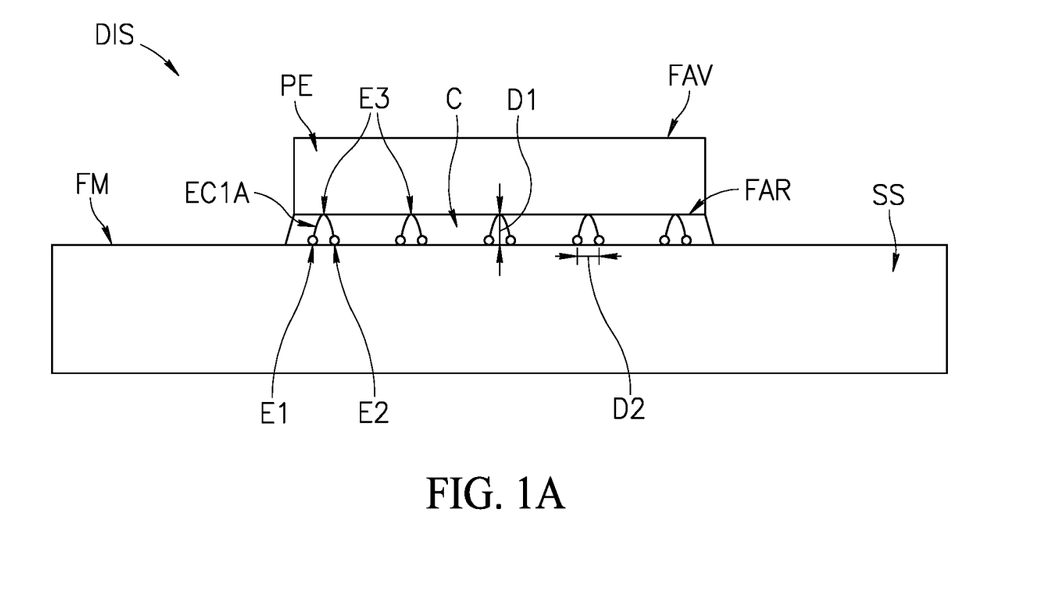
FIGS. 1A-1C illustrate an embodiment of an electronic device of the present disclosure.

FIG. 1A shows a side view of an electronic device DIS comprising a support substrate SS having a mounting face FM on which an electronic chip PE is fastened by a volume of adhesive C. The support substrate SS may be a semiconductor substrate, a printed circuit board (PCB), or some other substrate. The electronic chip PE may be a die, an electronic die, or a semiconductor die. The support substrate SS may include an opposite face that is opposite to the mounting face or surface FM.

Typically the support substrate SS comprises an interconnection network composed of metal tracks. The electronic chip PE is connected to the interconnection network of the support substrate SS, by means of metal connections (not shown), for example, soldered wire bonds.

The electronic chip PE has a front face FAV and a rear face FAR opposite to the front face FAV. The rear face FAR of the electronic chip is fastened or coupled to the mounting face FM of the support substrate SS.

The electronic chip PE can include an optical element incorporated on the front face FAV, such as an optoelectronic emitter or receiver.

The electronic chip PE can include, for example, an optical emitter element of the VCSEL laser diode type ("Vertical Cavity Surface Emitting LASER").

The features of the optical element may depend on the orientation of the optical element with respect to the mounting face FM of the support substrate SS, and therefore the features of the optical element may depend on the orientation of the front face FAV of the electronic chip with respect to the mounting face FM of the support substrate SS.

An example of a feature depending on the orientation of the optical element with respect to the mounting face FM is a solid angle over which the optical element can emit or receive radiation, this is typically the case for a "VCSEL" optical element.

It is therefore advantageous to hold the front face FAV of the electronic chip PE comprising the optical element in a controlled position.

To this effect, the rear face FAR of the electronic chip PE bears on a plurality of wedging elements EC1A rigidly attached to the mounting face FM and projecting with respect to the mounting face FM. The electronic chip PE is on the plurality of wedging elements EC1A.

The volume of adhesive C enables the rear face FAR of the electronic chip PE to be fastened to or coupled to the mounting face FM. The adhesive C is on the mounting face FM of the support substrate SS and on the rear face FAR of the electronic chip PE.

The adhesive C is formed on the mounting face FM of the support substrate SS in a crisscross shape. The adhesive C has a first portion P1 and a second portion P2 that overlap and extend in different directions. The first portion P1 is at an angle θ relative to P2. The angle θ may be 90-degrees, 60-degrees, 45-degrees, or some other similar or like angle. The crisscross or X shape may be a plus shape or a similar or like shape. The crisscross shape of the adhesive C may readily be seen in FIGS. 1B, 1C, 2B, 3B, and 3C of the present disclosure.

Holding the front face FAV of the electronic chip PE in position while bonding of the electronic chip PE to the mounting face FM of the support substrate SS utilizing the volume of adhesive C is particularly critical, and in particular, prior to solidification of the volume of adhesive C.

Indeed, while the volume of adhesive C is not yet solidified (e.g., before the volume of adhesive has solidified), the rear face FAR of the electronic chip PE is in contact with the volume of adhesive C while in a liquid or viscous form.

The plurality of wedging elements EC1A is distributed over the mounting face FM of the support substrate SS so that the rear face FAR of the electronic chip PE is held, at least in an isostatic manner and preferably in a hyperstatic manner, in a position, for example, parallel to the mounting face FM.

Hence, a light beam, for example emitted by the electronic chip PE, is thus orientated in the direction perpendicular or transverse to the mounting face FM.

The plurality of wedging elements EC1A makes it possible to hold the front face FAV of the electronic chip PE in a given or selected position, for example parallel to the mounting face FM, which also makes it possible to hold the incorporated optical element with an inclination that is zero or almost zero with respect to the mounting face FM.

The wedging elements EC1A are disposed, for example, on the periphery of an area defined on the mounting face FM by the projection of the rear face FAR of the electronic chip PE. In other words, the area defined on the mounting face FM is aligned with the rear face FAR of the electronic chip PE.

Spacing the wedging elements EC1A on the mounting face FM with respect to the center of the rear face FAR makes it possible to increase the stability of the holding of the electronic chip PE.

The volume of adhesive C is advantageously disposed around, or between, wedging elements EC1A, which makes it possible to avoid creating an excess thickness of the volume of adhesive C above certain wedging elements EC1A, and therefore avoiding an uncontrolled inclination of the rear face FAR of the electronic chip PE during the solidification of the volume of adhesive C.

FIGS. 1A to 2B show embodiments in which wire bonds are used to form a plurality of wedging elements EC1A, EC1B, EC1C, EC2A, EC2B supporting the electronic chip PE, which is shown transparently by the dashed contours, fastened to or coupled to a mounting face FM of a support substrate SS by an adhesive volume C, for example in the shape of a cross.

In the microelectronics industry, wire bonds are typically used for electrically connecting various inputs/outputs of electronic chips to the interconnection network of the support substrate.

Conventional techniques exist for manufacturing wire bonds (techniques that are usually termed "wire bonding") for forming wire bonds in a precise, rapid and economic manner.

The use of wire bonds in order to form the plurality of wedging elements therefore has the advantage of benefiting from optimizations of the technology for manufacturing wire bonds in order to manufacture the electronic device DIS.

Figure 1B:
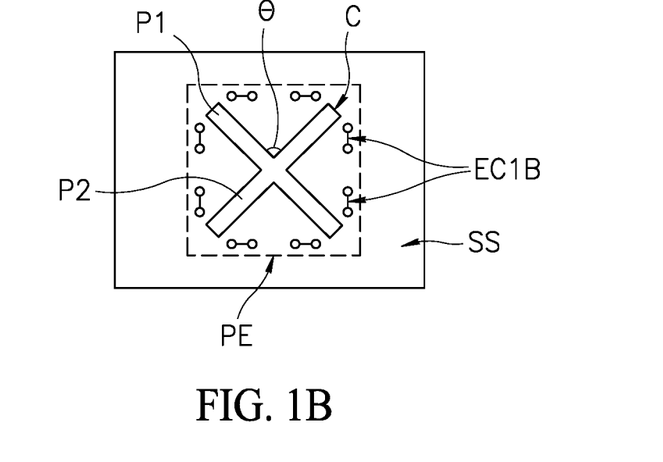

FIG. 1B shows a view from above of the embodiment described in relation to FIG. 1A.

In the embodiment illustrated by FIGS. 1A and 1B, each wedging element EC1B is formed of a wire bond stretched from a first end that is fastened or coupled to the support substrate SS to a second end also fastened or coupled to the support substrate SS.

The first and second end of each wire bond are situated in close vicinity to one another so that the wire bonds are arcuate in the shape of a U and have a curve with an extremum. The extremum forms a contact area on which the rear face FAR of the electronic chip PE rests. In other words, the wire bonds are arced to have a U-shape such that a peak of the U-shape supports the rear face FAR of the electronic chip PE.

Figure 1C:
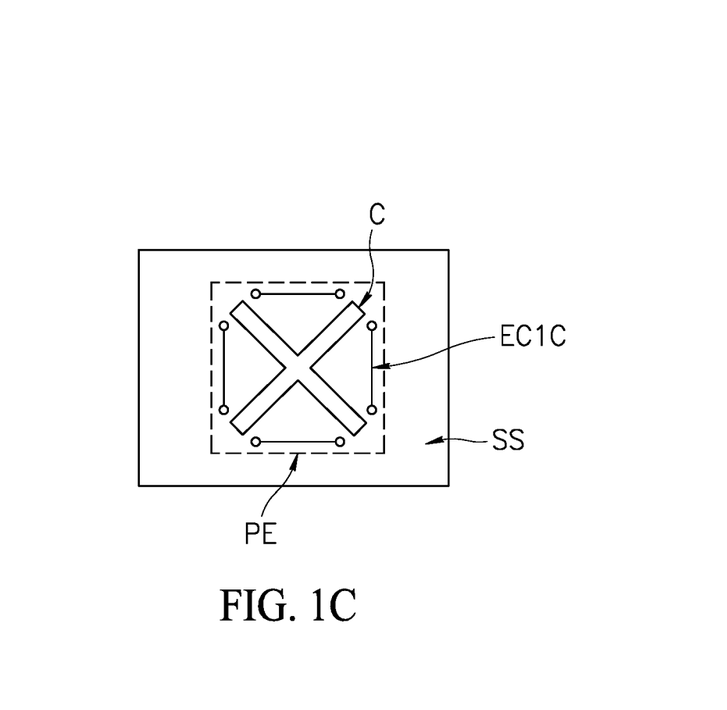

As shown in FIG. 1A, the plurality of wedging elements EC1A comprises arcuate wire bonds each comprising a first end E1 and a second end E2 soldered to the mounting face of the support substrate, and an extremum E3 forming said contact areas with the rear face of the electronic chip PE. The wedging elements EC1A, which may be arcuate wire bonds in FIG. 1A, have a parabolic shape in which the extremums E3 are at the contact areas of the wedging elements EC1A are in physical contact with the rear face FAR of the electronic chip PE. The extremum E3 is spaced apart from the mounting face FM by a first dimension D1 in a first direction, which is transverse or perpendicular to the mounting face FM. The first and second ends E1, E2 are spaced apart from each other by a second dimension D2 in a second direction, which is transverse or perpendicular to the first direction. The first dimension D1 is greater than the second dimension D2. The wedging elements EC1B, EC1C as shown in FIGS. 1B and 1C may have ends similar or like to the first and second ends E1, E2 of the wedging elements EC1A as shown in FIG. 1A. The wedging element EC1B, EC1C as shown in FIGS. 1B and 1C may have extremums similar or like to the extremums E3 as shown in FIG. 1A.

The ends E1 and E2 may each be a mass or volume of wire material that is continuous with the wire extend between the two ends. Said differently, each end has a width in a second direction that is greater than a width of the wire in the second direction.

FIG. 1C shows an embodiment in which each wedging element EC1C is formed of a wire bond stretched from a first end that is fastened to the support substrate SS to a second end also fastened to the support substrate SS.

The first and second end are separated from each other so that the wire bonds are also arcuate in the shape of a U, but extending longitudinally along the mounting face FM. These wedging element EC1C as shown in FIG. 1C may be longer than the wedging elements EC1A, EC1B as shown in FIGS. 1A and 1B. In other words, the distance between first and second ends of the wedging elements EC1C on the mounting face FM may be spaced apart by a dimension greater than the second dimension D2 as shown in FIG. 1A.

The longitudinally extending portion of the wire bonds is intended to form a contact area on which the rear face FAR of the electronic chip PE rests.

Figure 2A:
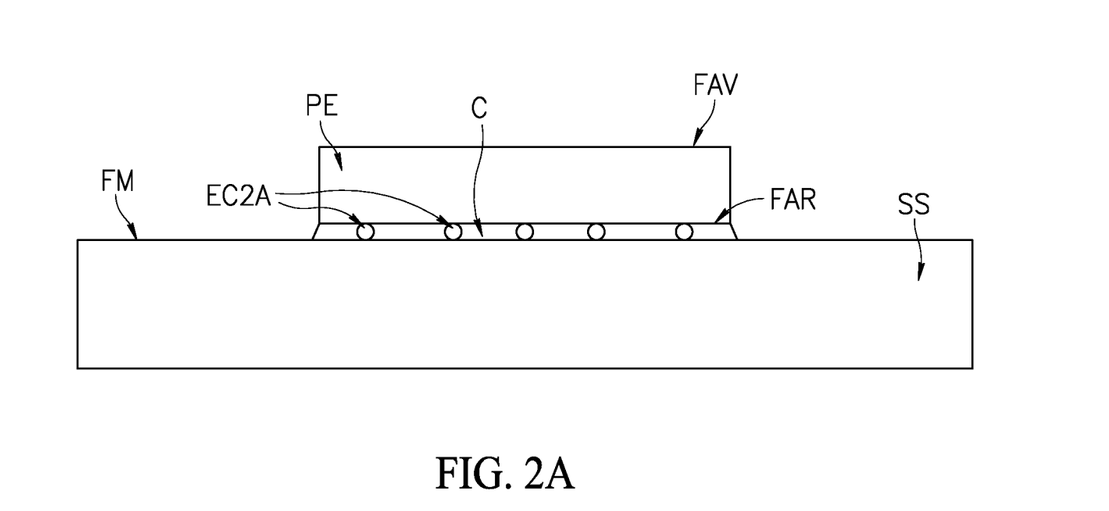
FIGS. 2A-2B illustrate an alternative embodiment of an electronic device of the present disclosure.

FIG. 2A shows a side view of a device according to an embodiment in which the electronic chip PE is bearing on a plurality of wedging elements each formed of a bond-wire "stud bump".

Each wire-bond stud bump is fastened or coupled to the mounting face FM of the support substrate SS. For example, each wire-bond stud bump may be soldered onto the mounting face FM of the support substrate SS.

Each stud bump comprises an associated wire bond, one end of which has been directly severed after the forming of the stud bump.

The end of the severed wire bond of each stud bump forms a contact area on which the rear face FAR of the electronic chip PE rests.

Such an embodiment is able to benefit from the minimal dimensions that a wire bond welded onto a surface can have.

Figure 2B:
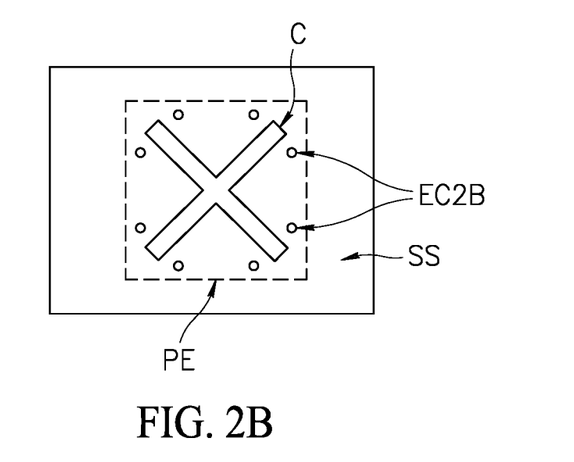

FIG. 2B shows a sectional view of the top of a device according to the embodiment described with reference to FIG. 2A.

The contours of the rear face FAR of the electronic chip PE are shown as a dashed line in FIG. 2B, the stud bumps are disposed at the periphery of the dashed area.

Figure 3A:
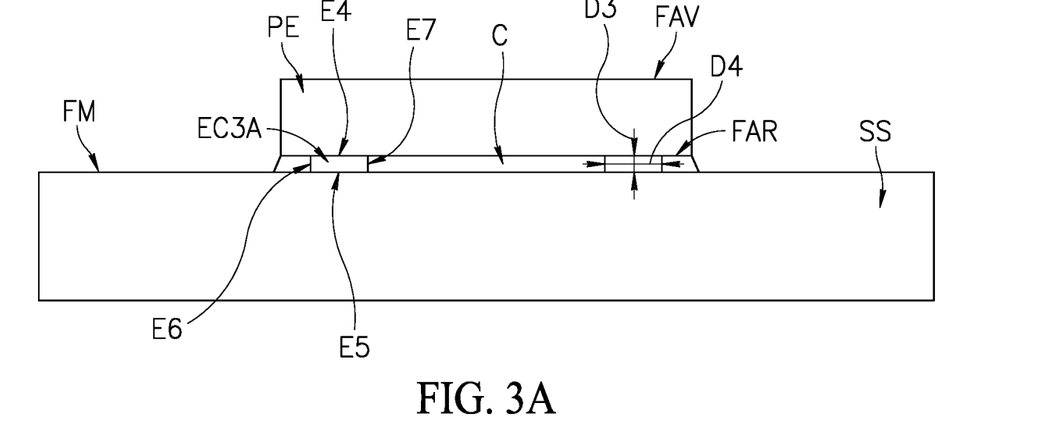
FIGS. 3A-3C illustrate alternative embodiments of electronic devices of the present disclosure.

FIG. 3A shows a side view of another example of the electronic device DIS comprising a support substrate SS comprising a mounting face FM on which an electronic chip PE is fastened by a volume of adhesive C.

In this example, the rear face FAR of the electronic chip PE is bearing on a plurality of wedging elements EC3A formed by projecting local thicknesses of a layer of material deposited on the mounting face FM.

Here, "projecting local thickness" means a volume which stands out in height from the surface of the mounting face. The projecting local thickness is fastened on the mounting face FM and comprises an upper surface intended to be in contact with the rear face FAR of the electronic chip PE. The projecting local thicknesses can be obtained, for example, by molding or etching in the pattern of a mask.

Thus, each wedging element formed with a projecting local thickness may take the form of a parallelepiped, a cylinder or, more generally, a volume of material that is raised with respect to the surface of the mounting face FM.

The projecting local thicknesses forming the plurality of wedging elements EC3A can be formed, for example, by a portion of metal tracks.

The portion of metal track can be of the same type as the metal tracks of an interconnection portion of the support substrate SS, typically made of copper, but formed so as to have a larger thickness than the metal tracks crossing the mounting face FM.

Alternatively, the plurality of wedging elements EC3A can be formed, for example, of a layer of resin of a solder mask etched or molded in the pattern of a mask, so as to form the projecting local thicknesses of resin.

The mask resin layer forming the local projecting thicknesses of resin can, for example, be deposited on another solder mask resin layer deposited beforehand on the mounting face FM.

As shown in FIG. 3A, each of the wedging elements EC3A includes a first end E4 and a second end E5 spaced apart from the first end E4 by a first dimension D3 extending in a first direction. Each wedging element EC3A includes a third end E6 and a fourth end E7 spaced apart from the third end E6 by a second dimension D4 extending in a second direction transverse to the first direction. Based on the embodiment shown in FIG. 3C, the second direction is perpendicular to the first direction, and the first dimension D3 is less than the second dimension D4. In other words, when the wedging element EC3C is in the form of the slab, the wedging element EC3C has a rectangular shape, and the wedging element EC3C has an upper rectangular surface at the contact area with the rear face FAR of the electronic chip P and a lower rectangular surface on the mounting face FM of the support substrate SS. The wedging elements EC3B, EC3C as shown in FIGS. 3B and 3C may have ends similar or like to the first, second, third, and fourth ends E4, E5, E6, E7 of the wedging elements EC3A as shown in FIG. 1A.

Figure 3B:
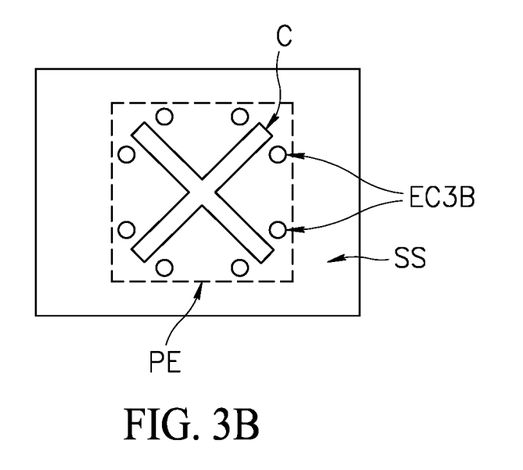
Figure 3C:
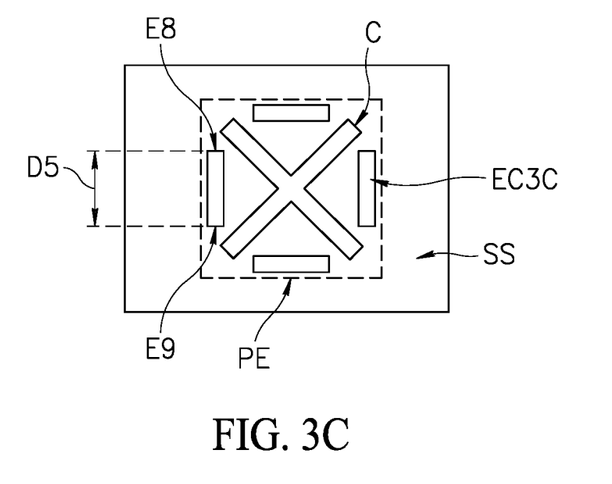

FIGS. 3B and 3C show two embodiments for disposing the local projecting thicknesses of material (in other words the metal of the tracks of the interconnection network or even the solder mask resin) described in relation to FIG. 3A.

FIG. 3B shows, for example, cylindrical wedging elements EC3B disposed at points on the mounting face FM of the support substrate SS.

Each cylindrical wedging element EC3B comprises a lower base fastened on the mounting face FM and a second, upper base in contact with the rear face FAR of the electronic chip PE.

FIG. 3C shows wedging elements EC3C in the form of slabs extending longitudinally along the mounting face FM of the support substrate SS.

The wedging element EC3C have a third dimension D5 that extends from a first end E8 to a second end E9. The third dimension D5 may be greater than the first and second dimensions D3, D4 as discussed earlier with respect to the wedging elements EC3A.

Figure 4:
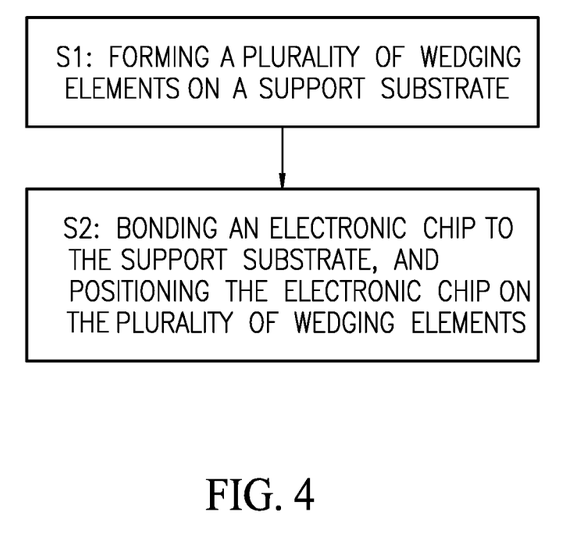
FIG. 4 illustrates a method for manufacturing embodiments and alternative embodiments of electronic devices of the present disclosure in relation to FIGS. 1A-1C, 2A-2B, and 3A-3C.

Each wedging element EC3C in the form of a slab comprises a lower surface fastened on the mounting face FM and a second, upper surface in contact with the rear face FAR of the electronic chip PE. FIG. 4 schematically illustrates a method for manufacturing an electronic device such as described above in relation to FIGS. 1A to 3C.

During a first step S1, the plurality of wedging elements projecting with respect to the mounting face FM (EC1A, EC1B, EC2A, EC2B, EC3A, EC3B, EC3C) are formed on the mounting face of the support substrate SS. In other words, the first step S1 is a wedging element formation step.

The wedging elements can be distributed at points over the mounting face FM of the support substrate SS or even take longitudinal shapes along the mounting face FM.

Then, during a second step S2, a rear face FAR of the electronic chip PE is bonded on the mounting face FM of the support substrate SS with a volume of adhesive C able, for example, to be disposed around the wedging elements. In other words, the second step is the electronic chip PE bonding step coupling the electronic chip PE to the support substrate SS, and the electronic chip PE is placed on the wedging elements.

When rear face FAR of the electronic chip PE is bonded to the mounting face FM of the support substrate SS by the adhesive C, the adhesive C spreads out covering sides or portions of the plurality of wedging elements EC1C, EC2A, EC2B, EC3A, EC3B, EC3C. This can be readily seen in FIGS. 1A, 2A, and 3A of the present disclosure and it will be readily appreciated how the adhesive C covers other embodiments of the plurality of wedging elements not shown in FIGS. 1A, 2A, and 3A.

The electronic chip PE is held in a fixed position bearing on the plurality of projecting wedging elements, for example in a position parallel with respect to the mounting face FM of the support substrate SS.

The first step S1 may comprise alternative implementations depending on the embodiment chosen for forming the wedging elements. In particular, the wedging elements can take the form of wire bonds, stubs of wire bonds or again local thicknesses of metal layers or of solder mask resin.

In the case of the example described with reference to FIGS. 1A, 1B and 1C, when the wedging elements EC1A, EC1B, EC2A, are formed by wire bonds, then the first step S1 comprises, for each wedging element, soldering a first end of a wire bond on the mounting face FM. Each wire bond is then stretched to give it an arcuate shape. Finally, a second end of the wire bond is soldered on the mounting face FM.

In the case of the example described with reference to FIGS. 2A and 2B, when the wedging elements EC2A, EC2B, are formed by stub bumps, then the first step S1 comprises, for each wedging element, soldering a wire-bond stud bump on the mounting face FM. Then, the wire bond associated with the stud bump is immediately severed so as to form a contact area on which the rear face FAR of the electronic chip PE will bear.

In the case of the examples described with reference to FIGS. 3A, 3B, 3C, when the wedging elements EC3A, EC3B, EC3C are formed by local thicknesses of resin of a solder mask, then the first step S1 comprises depositing a local thickness of solder mask resin, projecting with respect to the rest of the solder mask.

The first step S1 is thus advantageously implemented during a step of forming the solder mask covering a major part of the mounting face FM of the support substrate SS. The step of forming the solder mask, for example a Damascene solder mask, can typically comprise a deposit of resin on the mounting face FM of the support substrate SS through the patterns of a temporary mask, the openings of which are typically obtained using a laser.

When the wedging elements are formed by local thicknesses of metal track, then the first step S1 comprises depositing a local thickness of metal, typically copper or possibly gold, projecting with respect to the mounting face FM of the support substrate SS.

The first step S1 is thus advantageously implemented during a step of forming metal tracks of the interconnection network of the support substrate SS.

The step of forming metal tracks, for example Damascene metal tracks, can typically comprise a deposit of metal on the mounting face FM of the support substrate SS through the patterns of a temporary mask, the openings of which are typically obtained using a laser.

For example, the metal tracks can be deposited in the patterns of the temporary mask by means of a metal growth method.

The various implementation alternatives for steps S1 and S2, described above, all have the advantage of reusing conventionally provided and controlled packaging methods of microelectronic chips.

In other words, the embodiments and implementation described above in relation to FIGS. 1A to 4 make it possible to hold the electronic chip, non-inclined with respect to the mounting face of the support substrate, in a well-controlled and low-cost manner.

At least one embodiment of the present disclosure is directed to an electronic device (DIS) comprising a support substrate (SS) having a mounting face (FM) and an electronic chip (PE) having a rear face (FAR) bonded on the mounting face (FM) by a volume of adhesive (C), wherein the support substrate (SS) comprises a plurality of wedging elements (EC1A) projecting from the mounting face (FM) so as to hold the chip bearing on contact areas of the wedging elements (EC1A) in a position parallel to the mounting face (FM) of the support substrate (SS).

In some embodiments, the plurality of wedging elements (EC1A, EC1B, EC1C) comprises arcuate wire bonds each comprising a first end and a second end soldered to the mounting face (FM) of the support substrate (SS), and an extremum forming said contact areas with the rear face (FAR) of the electronic chip (PE).

In some embodiments, the plurality of wedging elements (EC2A, EC2B) comprises wire-bond stud bumps soldered on the mounting face (FM) of the support substrate (SS), each having one end of severed wire bond forming said contact areas with the rear face (FAR) of the electronic chip (PE).

In some embodiments, the mounting face (FM) of the support substrate (SS) is covered with a resin solder mask, and the plurality of wedging elements (EC3A, EC3B, EC3C) comprises projecting local thicknesses of resin of the solder mask, each having an upper surface forming said contact areas with the rear face (FAR) of the electronic chip (PE).

In some embodiments, the support substrate (SS) comprises an interconnection network including metal tracks, and the plurality of wedging elements comprises projecting local thicknesses of insulated portions of metal track, each having an upper surface forming said contact areas with the rear face (FAR) of the electronic chip (PE).

In some embodiments, the wedging elements (EC2B, EC3B) are distributed at points on the mounting face (FM) of the support substrate (SS).

In some embodiments, the wedging elements (EC1C, EC3C) have a shape extending longitudinally along the mounting face (FM) of the support substrate (SS).

In some embodiments, the volume of adhesive (C) is disposed around the wedging elements without covering said contact areas.

In some embodiments, the electronic chip (PE) includes at least one optical element incorporated on the front face (FAV) of the electronic chip (PE).

At least one embodiment of the present disclosure is directed to a method for manufacturing an electronic device (DIS), comprising: preparing (S1) a support substrate (SS) comprising forming a plurality of wedging elements (EC1A) projecting from a mounting face (FM) of the support substrate (SS), and mounting (S2) an electronic chip (PE) held bearing on the contact areas of the wedging elements in a position parallel to the mounting face of the support substrate, comprising bonding of a rear face of the electronic chip on the mounting face of the support substrate by means of a volume of adhesive (C).

In some embodiments, the forming of the plurality of wedging elements (EC1A, EC1B, ECIC) comprises, for each wedging element: soldering a first end of a wire bond on the mounting face (FM); and stretching the wire bond in order to give it an arcuate shape; and soldering a second end of the wire bond on the mounting face (FM).

In some embodiments, the forming of the plurality of wedging elements comprises, for each wedging element (EC2A, EC2B): soldering a wire-bond stud bump on the mounting face (FM); and severing the associated bond wire at the stud bump.

In some embodiments of a method for manufacturing an electronic device of the present disclosure, the method may include forming a resin soldering mask covering the mounting face (FM) of the support substrate (SS), wherein the forming of the plurality of wedging elements (EC3A, EC3B, EC3C) comprises, during the forming of the resin of the solder mask, forming at least one local thickness projecting from said resin so as to present an upper surface forming said contact areas with the rear face (FAR) of the electronic chip (PE).

In some embodiments of a method of manufacturing an electronic device of the present disclosure, the method may include forming metal tracks of an interconnection network of the support substrate (SS), wherein the forming of the plurality of wedging element comprises, during the forming of the metal tracks, forming of at least one local thickness projecting from an insulated portion of metal track so as to present an upper surface forming said contact areas with the rear face (FAR) of the electronic chip (PE).

In some embodiments, the forming of the plurality of projecting wedging elements (EC2B, EC3B) comprises a placement distributed at points on the mounting face (FM) of the support substrate (SS).

In some embodiments, the forming of the plurality of projecting wedging elements (EC1C, EC3C) comprises a longitudinal formation of wedging elements along the mounting face (FM) of the support substrate (SS).

In some embodiments, the bonding of the rear face of the electronic chip (PE) comprises depositing the volume of adhesive (C) around the wedging elements without covering said contact areas.

In some embodiments, the electronic chip includes at least one optical element incorporated on the front face of the electronic chip.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic device, comprising:
 a support substrate having a first face;
 an electronic chip having a second face coupled to the first face of the support substrate by an adhesive; and
 a plurality of arcuate wire bonds projecting from the first face of the support substrate, the second face of the electronic chip on contact areas of the plurality of arcuate wire bonds, the adhesive being between the plurality of arcuate wire bonds, each one of the plurality of arcuate wire bonds including:
  a first end and a second end coupled to the first face of the support substrate; and
  an extremum between the first end and the second end, the extremum contacting the second face of the electronic chip at the contact areas, the contact areas being exposed from the adhesive.

2. The device according to claim 1, wherein first ones of the plurality of arcuate wire bonds extend in a first direction along the first face of the support substrate and second ones of the plurality of arcuate wire bonds extend in a second direction transverse to the first direction.

3. The device according to claim 1, wherein the has a crisscross shape.

4. The device according to claim 1, wherein the electronic chip includes at least one optical element at a third face of the electronic chip opposite to the second face of the electronic chip.

5. The device according to claim 1, wherein the plurality of arcuate wire bonds are parabolic or U-shaped.

6. The device according to claim 3, wherein the adhesive has a first portion transverse a second portion, the first portion extending between first ones of the plurality of arcuate wire bonds, and the second portion extending between second ones of the plurality of arcuate wire bonds.

7. The device according to claim 1,
 wherein the extremum is spaced from the second face of the electronic chip for a first dimension along a first direction; and
 each one of the plurality of arcuate wire bonds further includes a second dimension in a second direction transverse the first direction between the first end and the second end, the first dimension being greater than the second dimension.

8. A method for manufacturing an electronic device, comprising:
 forming a plurality of arcuate wire bonds on a first face of a substrate projecting from the first face of the substrate, each arcuate wire bond of the plurality of arcuate wire bonds has an extremum between a first end and a second end;

forming an adhesive on the first face of the substrate spaced from the plurality of arcuate wire bonds, forming the adhesive including:
  forming a first portion extending in a first direction between first ones of the plurality of arcuate wire bonds; and
  forming a second portion extending in a second direction at an angle relative to the first portion between second ones of the plurality of arcuate wire bonds; and
 mounting an electronic chip on contact areas of the plurality of arcuate wire bonds by bonding a second face of the electronic chip to the first face of the substrate by the adhesive, the extremum contacting the second face of the electronic chip at the contact areas, the contact areas being exposed from the adhesive.

9. The method according to claim 8, wherein forming of the plurality of arcuate wire bonds further includes:
 coupling the first end of the arcuate wire bond to the first face;
 forming an arcuate shape of the arcuate wire bond; and
 coupling the second end of the arcuate wire bond to the first face.

10. The method according to claim 8, further comprises forming metal tracks of an interconnection network on the substrate, and wherein forming of the plurality of arcuate wire bonds includes:
 while forming the metal tracks, forming at least one local thickness projecting from an insulated portion of the metal tracks; and
 while forming the metal tracks, forming a surface of the insulated portion at the contact areas at a rear face of the electronic chip.

11. The method according to claim 8, wherein forming of the plurality of arcuate wire bonds includes forming the plurality of arcuate wire bonds at selected locations on the first face of the substrate.

12. The method according to claim 8, wherein the forming of the plurality of arcuate wire bonds includes:
 forming first ones of the plurality of arcuate wire bonds extending in a first direction on the first face of the substrate; and
 forming second ones of the plurality of arcuate wire bonds extending in a second direction on the first face of the substrate, the second direction being transverse to the first direction.

13. The method according to claim 8, wherein bonding the second face of the electronic chip to the first face of the substrate includes depositing the adhesive around the plurality of arcuate wire bonds without covering the contact areas.

14. The method according to claim 8, wherein the electronic chip includes at least one optical element at a third face of the electronic chip opposite to the second face of the electronic chip.

15. The method according to claim 8, wherein the angle is substantially 45 or 90-degrees.

16. A method of manufacturing an electronic device, comprising:
 forming a plurality of wedging elements on a first face of a substrate projecting from the first face of the substrate, forming the plurality of wedging elements further includes:
  forming the plurality of wedging elements from at least one of the following of a resin of a solder mask or a metal material;

forming an adhesive on the first face of the substrate spaced apart from the plurality of wedging elements, forming the adhesive including:
  forming a first portion extending in a first direction between ones of the plurality of wedging elements; and
  forming a second portion extending in a second direction at an angle relative to the first portion between second ones of the plurality of wedging elements; and
mounting an electronic chip on contact areas of the wedging elements by bonding a second face of the electronic chip to the first face of the substrate by the adhesive, the mounting the electronic chip to the contact areas of the wedging element includes spreading the adhesive out to extend outward from the plurality of wedging elements and cover the plurality of wedging element in the adhesive.

17. The method of claim 16, wherein forming the plurality of wedging elements further comprises forming the plurality of wedging elements to have a rectangular profile.

18. The method of claim 16, wherein forming the plurality of wedging elements further comprises forming the plurality of wedging elements to have a round profile.

19. The method of claim 16, wherein forming the plurality of wedging elements further comprises forming the plurality of wedging elements to have a cylindrical profile.

20. The electronic device of claim 1, wherein the adhesive is on side portions of the plurality of arcuate wire bonds.

* * * * *

UNITED STATES PATENT AND TRADEMARK OFFICE
CERTIFICATE OF CORRECTION

PATENT NO. : 12,272,922 B2
APPLICATION NO. : 18/408149
DATED : April 8, 2025
INVENTOR(S) : Fabien Quercia et al.

Page 1 of 1

It is certified that error appears in the above-identified patent and that said Letters Patent is hereby corrected as shown below:

In the Claims

Column 11, Claim 3, Line 39:
"wherein the has a" should read: -- wherein the adhesive has a --.

Column 12, Claim 9, Lines 18-19:
"wherein forming of the plurality" should read: -- wherein forming the plurality --.

Signed and Sealed this
Seventeenth Day of June, 2025

Coke Morgan Stewart
*Acting Director of the United States Patent and Trademark Office*